(12) United States Patent
Yu

(10) Patent No.: US 6,307,223 B1
(45) Date of Patent: Oct. 23, 2001

(54) COMPLEMENTARY JUNCTION FIELD EFFECT TRANSISTORS

(75) Inventor: Ho-yuan Yu, Saratoga, CA (US)

(73) Assignee: Lovoltech, Inc., Santa Clara, CA (US)

( * ) Notice: Subject to any disclaimer, the term of this patent is extended or adjusted under 35 U.S.C. 154(b) by 0 days.

(21) Appl. No.: 09/458,571

(22) Filed: Dec. 9, 1999

Related U.S. Application Data
(60) Provisional application No. 60/111,818, filed on Dec. 11, 1998.

(51) Int. Cl.[7] .................................................. H01L 29/72
(52) U.S. Cl. ...................... 257/256; 257/268; 257/272; 257/263; 257/264; 257/274; 257/277
(58) Field of Search ..................................... 257/256, 263, 257/264, 266, 268, 272, 274, 277

(56) References Cited

U.S. PATENT DOCUMENTS
5,945,699 * 8/1999 Young .................................. 257/256

* cited by examiner

*Primary Examiner*—Edward Wojciechowicz

(57) ABSTRACT

Junction Field Effect Transistor (JFET) offers fast switching speed than bipolar transistor since JFET is a majority carrier device. This invention comprises two normally "off" JFETs, one in N-channel and one in P-channel to form Complementary Junction Field Effect Transistors for high speed, low voltage and/or high current applications. The discrete device structure is disclosed in this invention. The integrated Complementary Junction Field Effect Transistors structure processed in standard CMOS process is disclosed in this invention. A vertical gate structure of Complementary Junction Field Effect Transistors is disclosed. Complementary Junction Field Effect Transistors structure is also disclosed in SOI substrate.

23 Claims, 4 Drawing Sheets

COMPLEMENTARY JFET CIRCUIT IN CMOS PROCESS

COMPLEMENTARY JFET CIRCUIT**

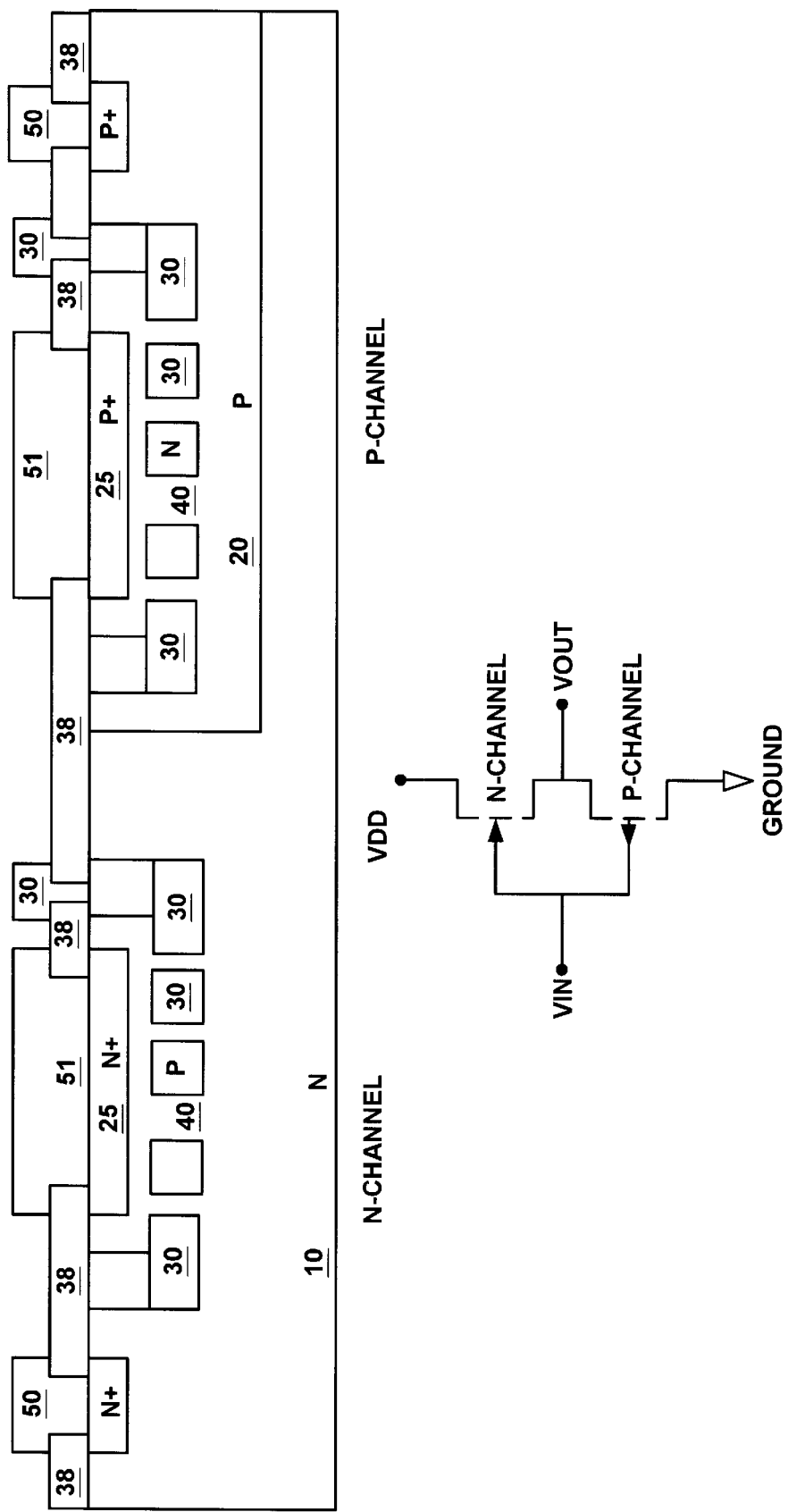
FIGURE 2 COMPLEMENTARY JFET CIRCUIT IN CMOS PROCESS

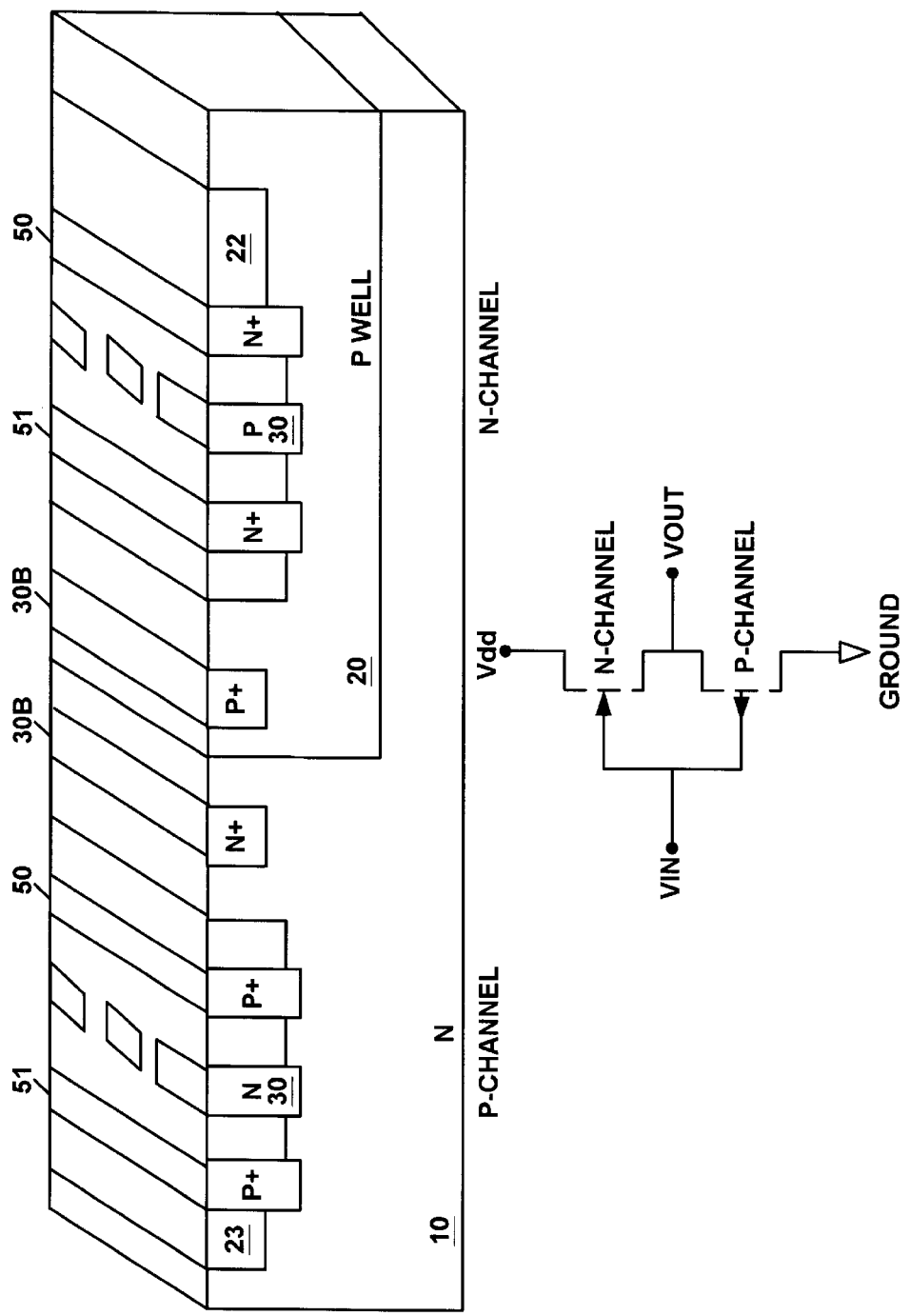
FIGURE 3 SIMPLIFIED COMPLEMENTARY JFET CIRCUIT IN VERTICAL GATE STRUCTURE

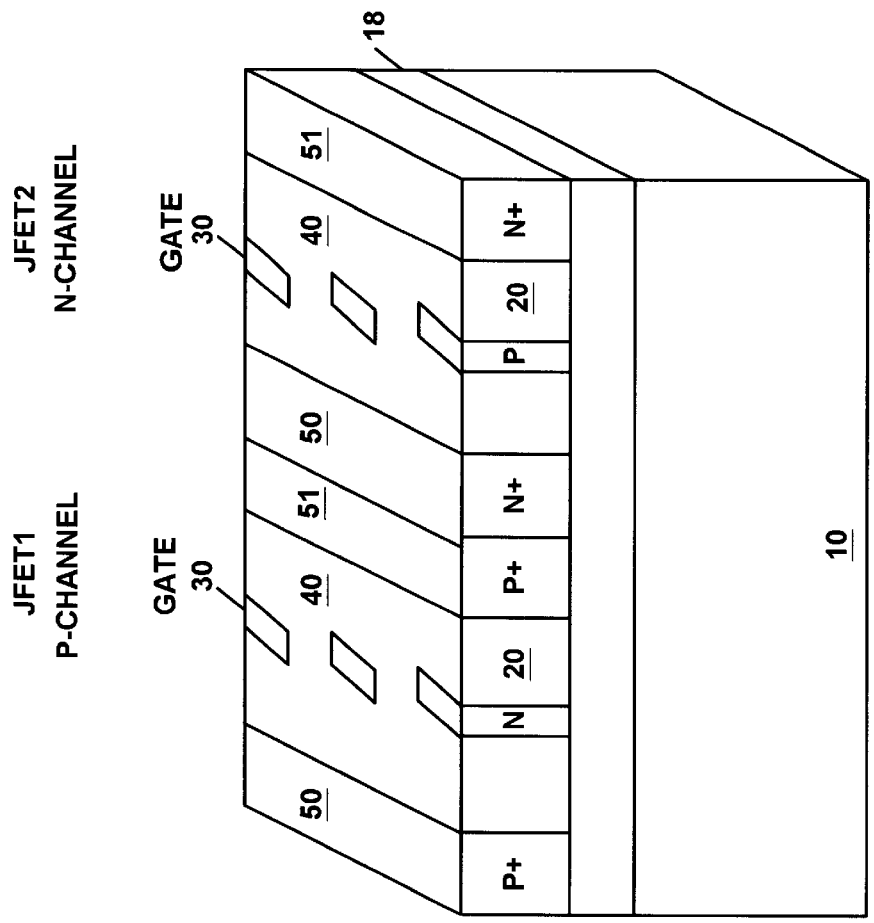
FIGURE 4  COMPLEMENTARY JUNCTION FIELD TRANSISTORS IN SOI PROCESS

COMPLEMENTARY JUNCTION FIELD EFFECT TRANSISTORS

This Application claims a Priority Date of Dec. 11, 1998, benefited from a previously filed Provisional Application 60/111,818 by the same Inventor of this Patent Application.

BACKGROUND OF THE INVENTION

1. Field of the Invention

This invention relates to the Complementary Junction Field Effect Transistors (CJFETs) that can be used in high speed electronic circuits for low voltage and/or large current applications. This invention is using enhancement mode or normally "off" Junction Field Effect Transistors with an N-channel JFET and a P-channel JFET in series connection. The gates of both normally "off" JFETs are connected together. This forms the Complementary Junction Field Effect Transistors.

2. Description of the Prior Art

The concept of Junction Field Effect Transistor (JFET) is well known since the invention of the junction transistors. Junction Field Effect Transistor is a majority carrier device, it offers high frequency response. However, the normally "off" JFET is using a P-N junction as the gate so that it is effective to turn-off the device by reverse bias the gate. This normally "on" or depletion mode FET is available in the market. Without readily available normally "off" or enhancement mode version, JFETs are not widely used as the MOSFETs (Metal-Oxide-Semiconductor Field Effect Transistors). In order to make the normally "off" FET, the distance between the gates must be smaller enough so that the depletion regions from both gates fill up the conduction channel. No current is flow when the gate is at zero bias. This means that at forward bias above the threshold voltage, the depletion region is smaller enough, the conduction channels between source and drain are open.

S. M. Sze has clearly described this concept in page 323, "Physics of Semiconductor Devices", $2^{nd}$ edition, John Wiley & Son, 1981. The symbols for N-type and P-type normally "on" and normally "off" JFET and MESFET are illustrated. However, in this book, the application of normally "off" JFET is described for high speed and low power application. Since the original device structure has very long channel length that limits the current carrying capability and high on resistance.

This inventor, Ho-Yuan Yu, has filed the following inventions: 1) "Low On Resistance Transistors and the Method of Making", filed in Patent Office of Disclosed Document Program, Sep. 24, 1998, #444899, has disclosed the device structures for high current and low on resistance applications. This is a normally "on" JFET. 2) "Novel Structure of JFETs for Low Voltage Application", filed in Patent Office of Disclosed Document Program, Sep. 17, 1998, #444874, disclosed the device structures of normally "off" JFETs for low voltage and high current applications. Above two documents have combined together to file a provisional patent application, #60/115,009 on Jan. 6, 1999 and filed utility patent application on Oct. 28, 1999. Present invention is using normally "off" JFETs with the structures shown in #60/115,009 and additional structures shown in this patent application with both N-channel and P-channel JFETs to perform the complementary circuitry function that can be used in high speed, low voltage and high current applications.

SUMMARY OF THE PRESENT INVENTION

This invention comprises a pair of N-channel and P-channel normally "off" or enhancement mode Junction Field Effect Transistors (JFETs) in series connection. The gates of both devices are connected together. Since the normally "off" JFET is using a forward bias of gate voltage in respect to the source and drain to turn on the device, the voltage range of the gate is normally less than +/−0.75V. Otherwise, the gate will draw large amount of current. A current limiting device to the gate can also be built in for Complementary Junction Field Effect Transistor structures. The threshold voltage for the gate is usually set around 0.2 V to 0.3V depending on the operating temperatures and applications. The threshold voltage of 0.2 V to 0.3V can allow the device to be operated up to 200 degree C. Actually, the gate voltage of 0.5V is sufficient to turn on the device and allow large amount of current flow from the source to drain or vise versa. The forward bias current of the gate at 0.5V is in the range of 3 to 5 orders of magnitude smaller than the source and drain current. This kind of device offers very attractive large current gain.

Normally "off" or enhancement mode JFETs can be built by several device structures. The original JFET structure is using double diffused method to create the conduction channel with source and drain located at the ends of the channel and the gate is located on the top of the conduction channel. This kind of structure has long channel length and it does not offer high current density and high packing density of the device on silicon chip. The device structures disclosed in the Inventor's previous patent application are suitable for high current and low voltage application. Additional device structure on SOI wafers is also disclosed in this patent application.

The Complementary Junction Field Effect Transistors can be built either with the discrete devices, the integrated device, and the device built in standard CMOS or SOI process that can be used as the building block of the Complementary JFETs for modern circuitry.

BRIEF DESCRIPTION OF THE DRAWINGS

FIG. 2 shows the cross section of an integrated Complementary JFET with an N-channel JFET and a P-channel JFET in P-well CMOS IC process.

FIG. 3 is a Complementary JFET with vertical gate structure using CMOS IC process.

FIG. 4 is a Complementary JFET in SOI structure.

DETAILED DESCRIPTION OF THE PREFERRED EMBODIMENT

Figure 1:
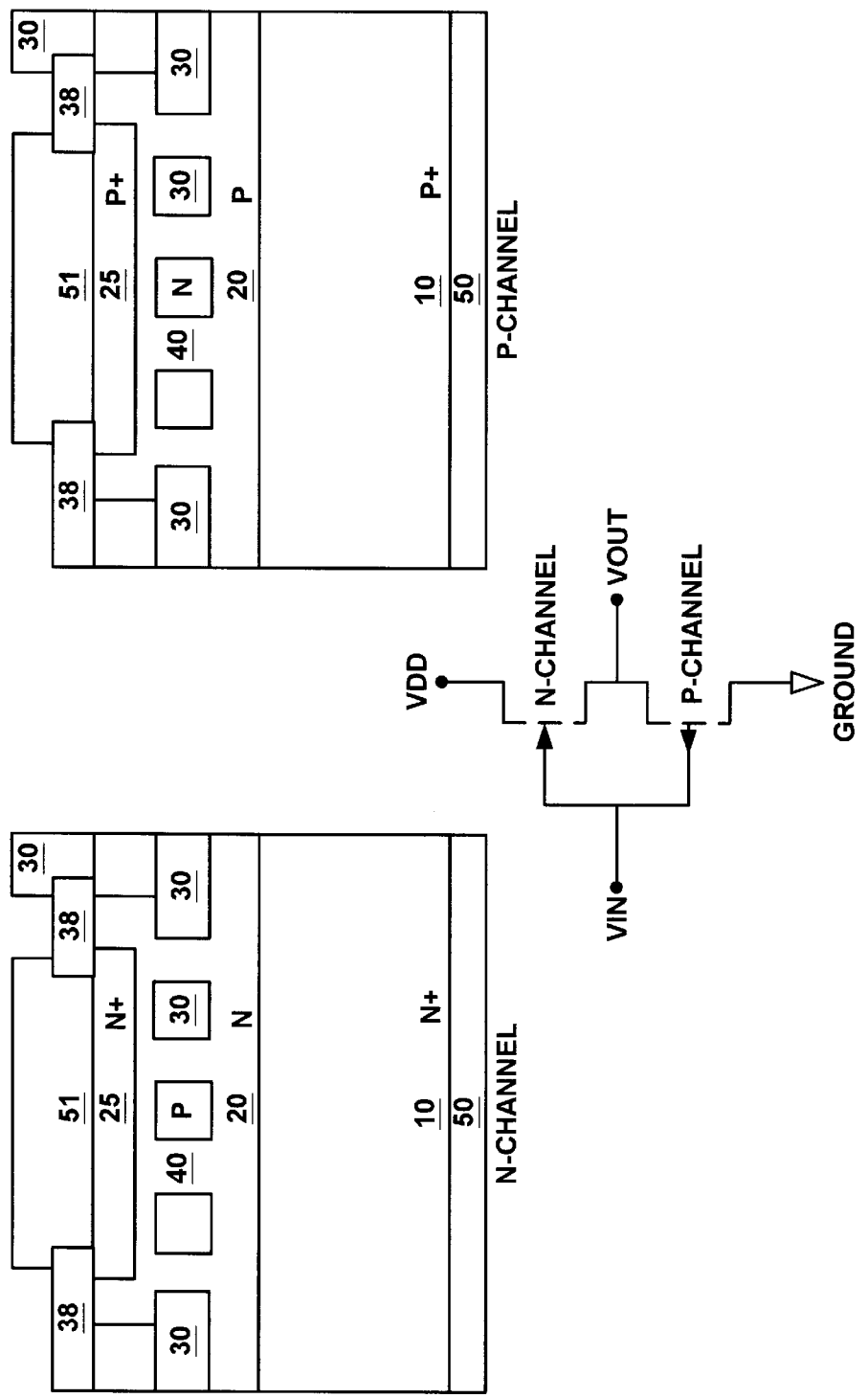
FIG. 1 illustrates the cross section of an N-channel JFET and a P-channel JFET. When they are in series connection, the Complementary JFETs are formed.

FIG. 1 illustrates the cross-sectional structure of an N-channel and a P-channel JFET for Complementary JFETs. These JFETs are built on heavily doped substrate 10 either N type or P type. The epitaxial layer 20 is grown on the top of the substrate 10 with similar polarity as the substrate. N-channel is using N type epitaxial layer 20. Likewise, P-channel is using P type epitaxial layer 20. The purpose of the epitaxial layer 20 is to provide the vertical conduction channel between the gate grid 30. The control gate grid 30 is formed either by implant, trench, or double epitaxial process with different polarity than epitaxial layer 20. Implant method is demonstrated in this Figure. The gate grid 30 is connected together and connected to the gate pad on the top of the wafer surface. The oxide layer 38 is used to separate the gate grid 30 and the upper electrode or the source 51. This oxide layer can be formed either by thermal oxidation or CVD oxide deposition following by lithography and contact etch process. As the distance W 40 between the gate grid 30 becomes smaller than the sum of the depletion layer from the control grid 30, the device is closed at zero gate bias condition. This is the basic requirement for the normally "off" or enhancement mode JFET. Only requirement in this case to conduct the current between source and drain is to apply a forward voltage bias to the gate grid 30 respect to the source 51 and drain 50 region since the forward bias reduces the depletion region width adjoining to the control gate 30. Therefore conduction paths are allowed. The width W 40 and the doping concentration of the epitaxial layer basically determine the threshold voltage of the device. In general, the threshold voltage of 0.2 V to 0.3 V is preferred so that device can be operated up to 200 degree C. For example, when the forward bias of 0.5 V is applied to the gate, the gate grid 30 creates enough conduction paths that allow large current flow under very low voltage of 0.1 V or less between the source 51 and drain 50. Since the forward bias between the gate grid 30 and the epitaxial 20 is only 0.5 V, the forward current is relatively small and it is in the range of two to five orders magnitude below the current flow between the source 51 and drain 50. In this device structure, the Complementary JFET is able to switch the circuits at very high frequency in very low voltage and relatively high current condition. The discrete form of Complementary JFETs can be used in power switching for low voltage and large current applications.

FIG. 2 illustrates the Complementary JFETs structure with P-well CMOS process inside N-well. The substrate 10 is an N type material. P-well is made with ion implant and deep diffusion process. The implant dose and energy determines P-channel device characteristics such as the threshold voltage and on resistance of conduction channel. The gate grid 30 for the N-channel JFET is P type polarity and for the P-channel JFET is N type polarity. The gate grid 30 can be made either by implant/diffusion, trench process, or double epitaxial process. For N-channel JFET, the source 51 and drain 50 are attached to heavily doped N+ layer 25. Source 51 is connected to layer 25 and it is located on the top of the gate grid 30. Drain 50 is located at the side of the gate grid 30. The P-channel is formed in a similar way with opposite doping polarity. By connecting the gate 30 of both N-channel JFET and P-channel JFET together forms Vin terminals of the Complementary JFETs circuitry. A current limiting device, such as a JFET without gate, can be used to provide the protection to the device. The source 51 of N-channel JFET is connected to Vdd. The drain 51 of N-channel JFET is connected to the source 50 of P-channel JFET and it forms the terminal Vout. The drain of P-channel JFET is the terminal that connected to the ground or a common line. The position of N-channel JFET and P-channel JFET can be exchanged in this circuitry. Thus the Complementary JFETs device structure is illustrated in this Figure. This kind of device structure can also be made by standard N-well CMOS IC process.

FIG. 3 shows the Complementary JFETs with vertical gate structure. The advantage of this structure is that both source 51, drain 50 and the gate grid 30 can be made deeper from the surface by trench or via etch for better utilization of the silicon real estate. P-well inside N-well is demonstrated in this Figure. The conduction channel 23 is formed by boron implant for P-channel JFET. Likewise, the conduction channel 22 is formed by phosphorus implant for the N-channel device. The implant energy and doping concentration is determined by the device design. The doping concentration for the conduction channel after implant process is in the range of 1.00E 15 to over 1.00E 17 cm-3 depending on the application. The gate 30, source 51 and drain 50 is formed by trench/via etch. The depth of the trench and via etch must be deeper than the depth of the conduction channels 22 and 23 for the isolation purpose. The source 51 and drain 50 of both N-channel JFET and P-channel JFET is formed by trench etch followed by doped poly silicon deposition and etch back. The doping of the poly silicon is the same polarity of the conduction channel. The gate is formed by the via/trench etch and deposited with doped poly silicon in opposite polarity of the conduction channel. Similar process can be used for the completion of source/drain of source/drain of P-channel device and the gate of N-channel device. The back gate 30B is also shown in this Figure. This Figure illustrates basic structure without top oxide isolation layer and connecting metal structure.

FIG. 4 is the Complementary JFETs in SOI structure. SOI is silicon on insulator structure. SOI can be produced by either deep oxygen ion implant; bonding of two wafers with an oxide layer in between at high temperature follow by etch back or polish back; or other means. SOI is an excellent structure for device isolation and it gives more freedom for device construction. The substrate 10 is used for the mechanical support. The interlayer oxide 18 provides dielectric isolation. The thickness of this oxide layer 18 is in the range from less than 1000 A to over 2 microns depending on the application. The heavily doped source 51, drain 50 and the gate 30 can be done by ion implant method for the thickness of layer 20 less than one micron or by trench method when the thickness of the layer 20 is larger than one micron. The gate 30 is constructed in vertical version as shown in this Figure. The width W 40 between the gate grid is determined by patterned lithography process and the thermal process followed by the implant. Threshold voltage Vt of the device is determined by the width W 40 and the doping concentration of the base layer 20. This is the basic structure of the complementary JFET in SOI structure.

What is claimed is:

1. A complementary junction field effect transistor (JFET) circuit structure comprising:

an enhancement mode P-channel junction field effect transistor (JFET) having a Gate, Source and Drain; and an enhancement mode N-channel junction field effect transistor (JFET) having a Gate, Source and Drain;

wherein one of either of the Drain or the Source of said enhancement mode P-channel JFET is electrically coupled to one of either of the Drain or the Source of said enhancement N-channel JFET and wherein the Gate of said enhancement mode P-channel JFET is electrically coupled to the Gate of said enhancement mode N-channel JFET.

2. The complementary JFET circuit structure of claim 1 wherein the Drain of the enhancement mode P-channel JFET is electrically coupled to the Drain of the enhancement mode N-channel JFET.

3. The complementary JFET circuit structure of claim 1 wherein the Source of the enhancement mode P-channel JFET is electrically coupled to the Drain of the enhancement mode N-channel JFET.

4. The complementary JFET circuit structure of claim 3 wherein the Source of the enhancement mode N-channel JFET is electrically coupled to a voltage source Vdd and the Drain of the enhancement mode P-channel JFET is electrically coupled to ground.

5. The complementary JFET circuit structure of claim 1 wherein the Drain of the enhancement mode P-channel JFET is electrically coupled to the Source of the enhancement mode N-channel JFET.

6. The complementary JFET circuit structure of claim 5 wherein the Source of the enhancement mode P-channel JFET is electrically coupled to a voltage source Vdd and the Drain of the enhancement mode N-channel JFET is electrically coupled to ground.

7. A complementary junction field effect transistor (JFET) circuit structure comprising:

an enhancement mode P-channel junction field effect transistor (JFET);

an enhancement mode N-channel junction field effect transistor (JFET);

wherein one of either of the Drain or the Source of said enhancement mode P-channel JFET is electrically coupled to one of either of the Drain or the Source of said enhancement N-channel JFET; and wherein the Gate of said enhancement mode P-channel JFET is electrically coupled to the Gate of said enhancement mode N-channel JFET; and wherein the Gate of the enhancement mode N-channel JFET comprises a plurality of electrically coupled gate elements separated by a distance W1, wherein each gate element is surrounded by a depletion region;

wherein the Gate of the enhancement mode P-channel JFET comprises a plurality of electrically coupled gate elements separated by a distance W2, wherein each gate element is surrounded by a depletion region;

wherein the threshold voltage for at least one of either the P-channel JFET or the N-channel JFET has been adjusted by increasing and decreasing the channel doping concentration near each depletion region surrounding each gate element and subsequently adjusting distances W1 and W2 by using an RTA thermal process.

8. The complementary JFET circuit structure of claim 7 wherein the Drain of the enhancement mode P-channel JFET is electrically coupled to the Drain of the enhancement mode N-channel JFET.

9. The complementary JFET circuit structure of claim 7 wherein the Source of the enhancement mode P-channel JFET is electrically coupled to the Drain of the enhancement mode N-channel JFET.

10. The complementary JFET circuit structure of claim 7 wherein the Drain of the enhancement mode P-channel JFET is electrically coupled to the Source of the enhancement mode N-channel JFET.

11. The complementary JFET circuit structure of claim 7 wherein the threshold voltage is between 0.2 and 0.3 volts.

12. The complementary JFET circuit structure of claim 7 wherein the enhancement mode P-channel JFET and the enhancement mode N-channel JFET are formed on a common semiconducting substrate.

13. The complementary JFET circuit structure of claim 12 wherein the enhancement mode P-channel JFET and the enhancement mode N-channel JFET are formed using a CMOS process.

14. The complementary JFET circuit structure of claim 12 wherein the common semiconducting substrate comprises an N+ type layer.

15. The complementary JFET circuit structure of claim 14 further comprising an N-epitaxial layer.

16. The complementary JFET circuit structure of claim 7 wherein the enhancement mode P-channel JFET and the enhancement mode N-channel JFET are formed on a common nonconducting substrate.

17. The complementary JFET circuit structure of claim 16 wherein the common nonconducting substrate consists of a dielectric material.

18. The complementary JFET circuit structure of claim 16 wherein the common nonconducting substrate comprises a semiconducting layer and a nonconducting layer.

19. The complementary JFET circuit structure of claim 16 wherein the enhancement mode P-channel JFET and the enhancement mode N-channel JFET are formed using an SOI process.

20. A method of fabricating a complementary JFET circuit structure comprising the steps of:

on a N-type substrate, forming a first plurality of gates for a N-channel JFET separated by a distance, W1, wherein each gate is surrounded by a depletion region;

forming a P-type well on said N-type substrate;

on said P-type well, forming a second plurality of gates for a P-channel JFET separated by a distance, W2, wherein each gate is surrounded by a depletion region;

adjusting a threshold voltage for said N-channel JFET and said P-channel JFET by increasing and decreasing channel doping concentration near each depletion region surrounding each gate wherein increasing said channel doping concentration near each depletion region decreases said threshold voltage; and adjusting said threshold voltage by adjusting said distance W1 and said distance W2, using an RTA thermal process prior to metalization.

21. The product of the method of claim 20.

22. A method of fabricating a complementary JFET circuit structure comprising the steps of:

on a P-type substrate, forming a first plurality of gates for a P-channel JFET separated by a distance, W2, wherein each gate is surrounded by a depletion region;

forming a N-type well on said P-type substrate;

on said N-type well, forming a second plurality of gates for a N-channel JFET separated by a distance, W1, wherein each gate is surrounded by a depletion region;

adjusting a threshold voltage for said N-channel JFET and said P-channel JFET by increasing and decreasing channel doping concentration near each depletion region surrounding each gate wherein increasing said channel doping concentration near each depletion region decreases said threshold voltage; and adjusting said threshold voltage by adjusting said distance W1 and said distance W2, using an RTA thermal process prior to metalization.

23. The product of the method of claim 22.

\* \* \* \* \*